(12) United States Patent
Inoue et al.

(10) Patent No.: US 6,441,596 B1
(45) Date of Patent: Aug. 27, 2002

(54) SWITCHING REGULATOR WITH REDUCED HIGH-FREQUENCY NOISE

(75) Inventors: Koichi Inoue; Takao Osuka, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/793,393

(22) Filed: Feb. 27, 2001

(30) Foreign Application Priority Data

Feb. 29, 2000 (JP) ........................................ 2000-057984

(51) Int. Cl.$^7$ ................................................ G05F 1/56
(52) U.S. Cl. ........................................ 323/282; 323/288
(58) Field of Search ................................ 323/282, 288

(56) References Cited

U.S. PATENT DOCUMENTS

| | | | | |
|---|---|---|---|---|
| 4,536,700 A | * | 8/1985 | Bello et al. ................ | 323/288 |
| 5,170,333 A | * | 12/1992 | Niwayama ................ | 323/288 |
| 5,627,459 A | * | 5/1997 | Itoyama et al. ............ | 323/288 |
| 5,777,503 A | * | 7/1998 | Faulk ........................ | 323/288 |
| 6,011,706 A | * | 1/2000 | Adragna et al. ........... | 323/288 |
| 6,057,675 A | * | 5/2000 | Tateishi .................... | 323/288 |
| 6,115,274 A | * | 9/2000 | Mao .......................... | 323/288 |
| 6,229,293 B1 | * | 5/2001 | Farrenkopf ............... | 323/288 |
| 6,294,905 B1 | * | 9/2001 | Schwartz .................. | 323/288 |

* cited by examiner

Primary Examiner—Jeffrey Sterrett
(74) Attorney, Agent, or Firm—Arent Fox Kintner Plotkin & Kahn

(57) ABSTRACT

A switching regulator, by turning a switching device on and off, converts the level of a direct-current voltage fed in via an input terminal, and then feeds out the thus level-converted voltage via an output terminal. A waveform shaping circuit blunts the waveform of the signal with which the switching device is turned on and off.

6 Claims, 5 Drawing Sheets

SWITCHING REGULATOR WITH REDUCED HIGH-FREQUENCY NOISE

BACKGROUND OF THE INVENTION

1. Field of the Invention

The present invention relates to a switching regulator that converts the level of a direct-current voltage by turning on and off a switching device.

2. Description of the Prior Art

First, a prior-art example will be described with reference to FIG. 4, which shows a conventional switching regulator of a step-down type. A p-channel MOS field-effect transistor (hereinafter referred to simply as a "transistor") Tr is used as a switching device, and the source of this transistor Tr is connected to an input terminal IN. The drain of the transistor Tr is connected to the cathode of a diode D and also to one end of a coil L. The anode of the diode D is grounded. The other end of the coil L is grounded through a smoothing capacitor C. The node between the coil L and the capacitor C is connected to a terminal OUT.

The voltage th at appears at the terminal OUT for output is divided by resistors $R_1$ and $R_2$, and the thus divided voltage $V_d$ is, together with a reference voltage $V_{ref}$, fed to an error amplifier EA, which outputs a voltage according to the difference between the two voltages fed thereto. Specifically, as the voltage $V_d$ increases relative to the reference voltage $V_{ref}$, the output voltage of the error amplifier EA decreases, and, as the voltage $V_d$ decreases relative to the reference voltage $V_{ref}$, the output voltage of the error amplifier EA increases.

The output voltage of the error amplifier EA is, together with a triangular-wave voltage output from a triangular wave generating circuit TPG, fed to a comparator COMP, which outputs a high-level voltage when the voltage of the triangular wave is higher than the output voltage of the error amplifier EA and outputs a low-level voltage when the voltage of the triangular wave is lower than the output voltage of the error amplifier EA. The voltage output from the comparator COMP is fed through a buffer amplifier BA to the gate of the transistor Tr.

The circuit configuration described above keeps the transistor Tr turned on and off repeatedly. When the transistor Tr is turned from on to off, a back electromotive force appearing in the coil L tends to keep a current flowing from ground through the diode D. This causes the drain voltage of the transistor Tr to become lower than the ground voltage by the voltage drop across the diode D, and thus the direct-current voltage fed out via the terminal OUT (this voltage will hereinafter be referred to as the "output voltage") becomes lower than the direct-current voltage fed in via the terminal IN.

The level of the output voltage varies according to the duty ratio of the "on" periods of the transistor Tr (specifically, the greater the duty ratio, the higher the output voltage). When the level of the output voltage is higher than a predetermined level, the duty ratio decreases, and, when the level of the output voltage is lower than the predetermined level, the duty ratio increases. In this way, the level of the output voltage is stabilized at the predetermined level.

However, in this conventional switching regulator, as shown in FIG. 5, the signal $O_{COMP}$ output from the comparator COMP is a pulse signal that abruptly rises and drops (in other words, a signal that contains higher-frequency, or harmonic, components), and this signal is directly fed to the gate of the transistor Tr to turn it on and off. As a result, quite inconveniently, high-frequency noise N of the order of tens of millivolts appears in the output voltage $V_{OUT}$. For this reason, conventional switching regulators cannot be used in audio and visual applications, and it has customarily been inevitable to use instead series regulators that are inefficient and generate much heat.

SUMMARY OF THE INVENTION

An object of the present invention is to provide a switching regulator that outputs a direct-current voltage with significantly reduced high-frequency noise.

To achieve the above object, according to the present invention, a switching regulator that converts the level of a direct-current voltage by turning a switching device on and off is provided with a waveform shaping circuit that blunts the waveform of the signal with which the switching device is turned on and off. With this circuit configuration, it is possible to remove high-frequency components from the signal with which the switching device is turned on and off.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
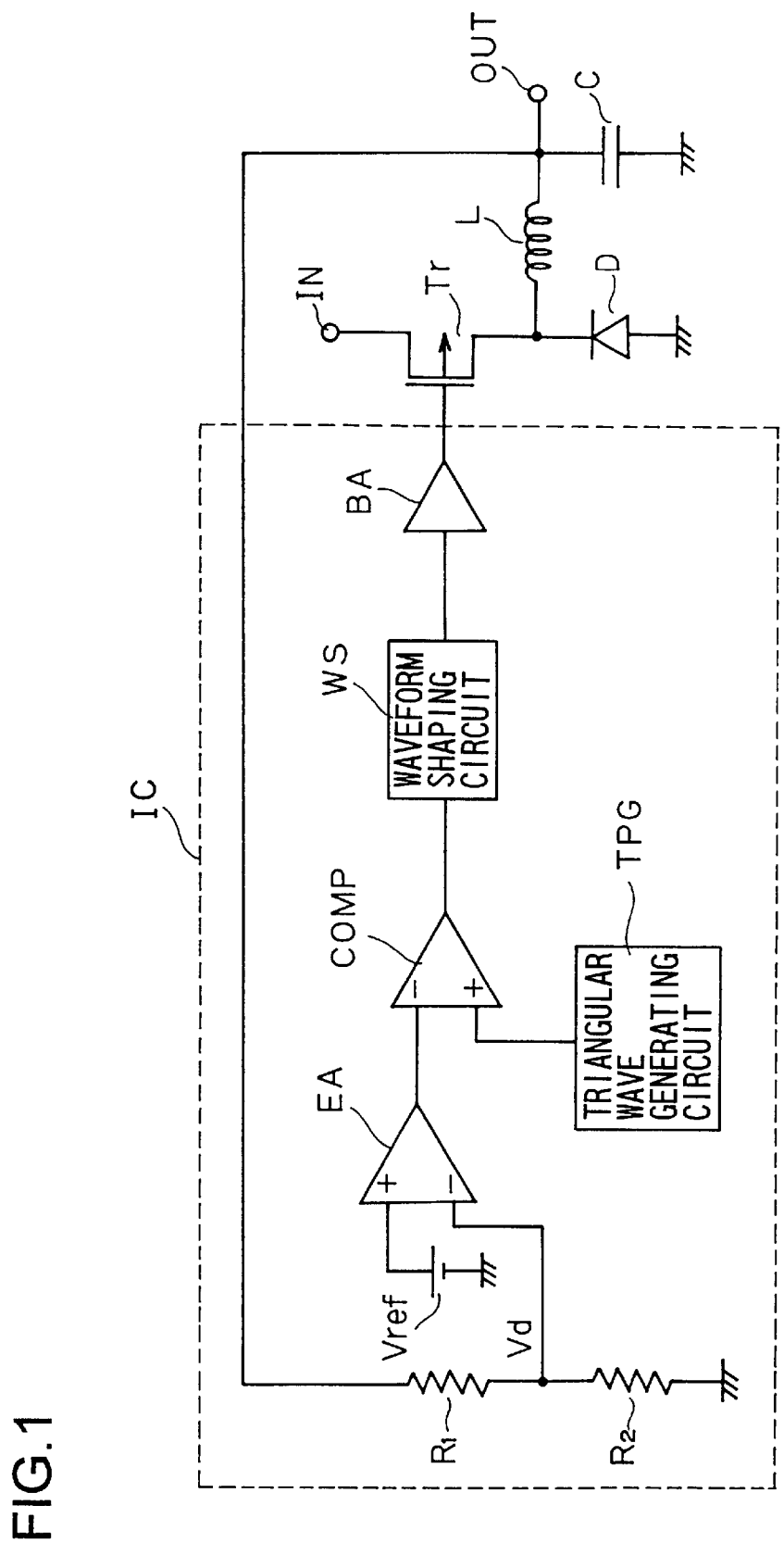
FIG. 1 is a circuit diagram of a switching regulator embodying the invention.
Figure 4:
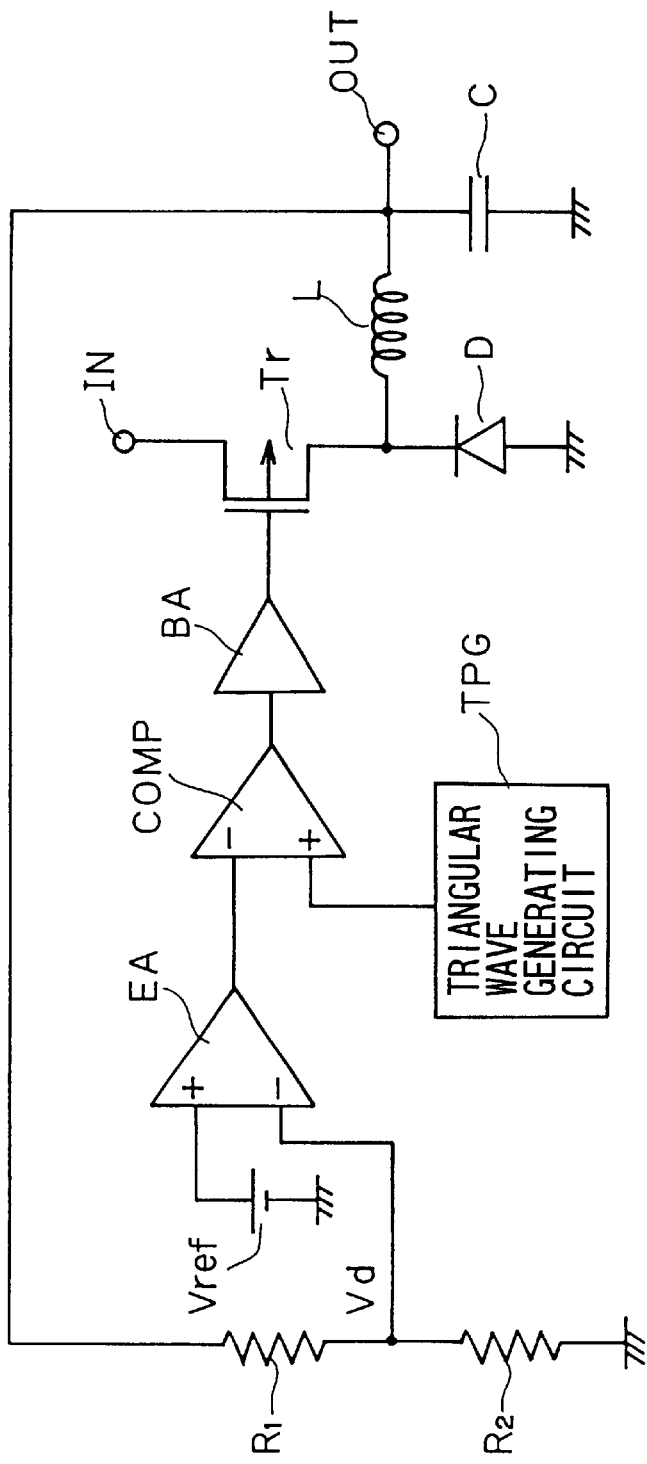
FIG. 4 is a circuit diagram of a conventional switching regulator.

Hereinafter, an embodiment of the present invention will be described with reference to the drawings. FIG. 1 shows a circuit diagram of a switching regulator embodying the invention. Here, such circuit elements as are found also in the conventional example shown in FIG. 4 are identified with the same reference symbols, and their explanations will not be repeated. The switching regulator of this embodiment has, between the output side of the comparator COMP and the input side of the buffer amplifier BA, a waveform shaping circuit WS that blunts a signal fed thereto and then outputs the resulting signal. The circuit elements enclosed by broken lines are formed in a single semiconductor integrated circuit device.

Figure 2:
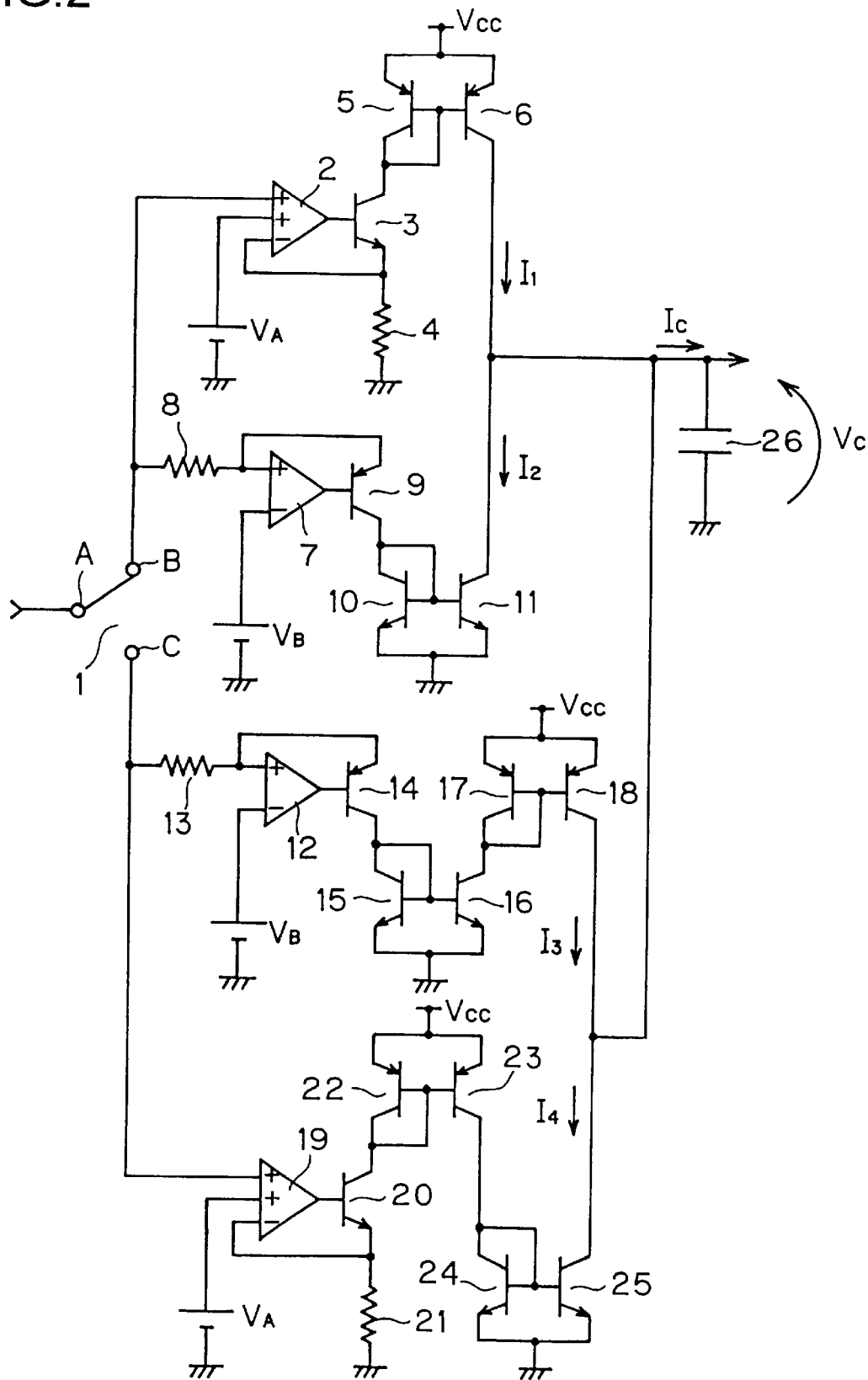
FIG. 2 is a circuit diagram showing an example of the circuit configuration of the waveform shaping circuit.
Figure 3:
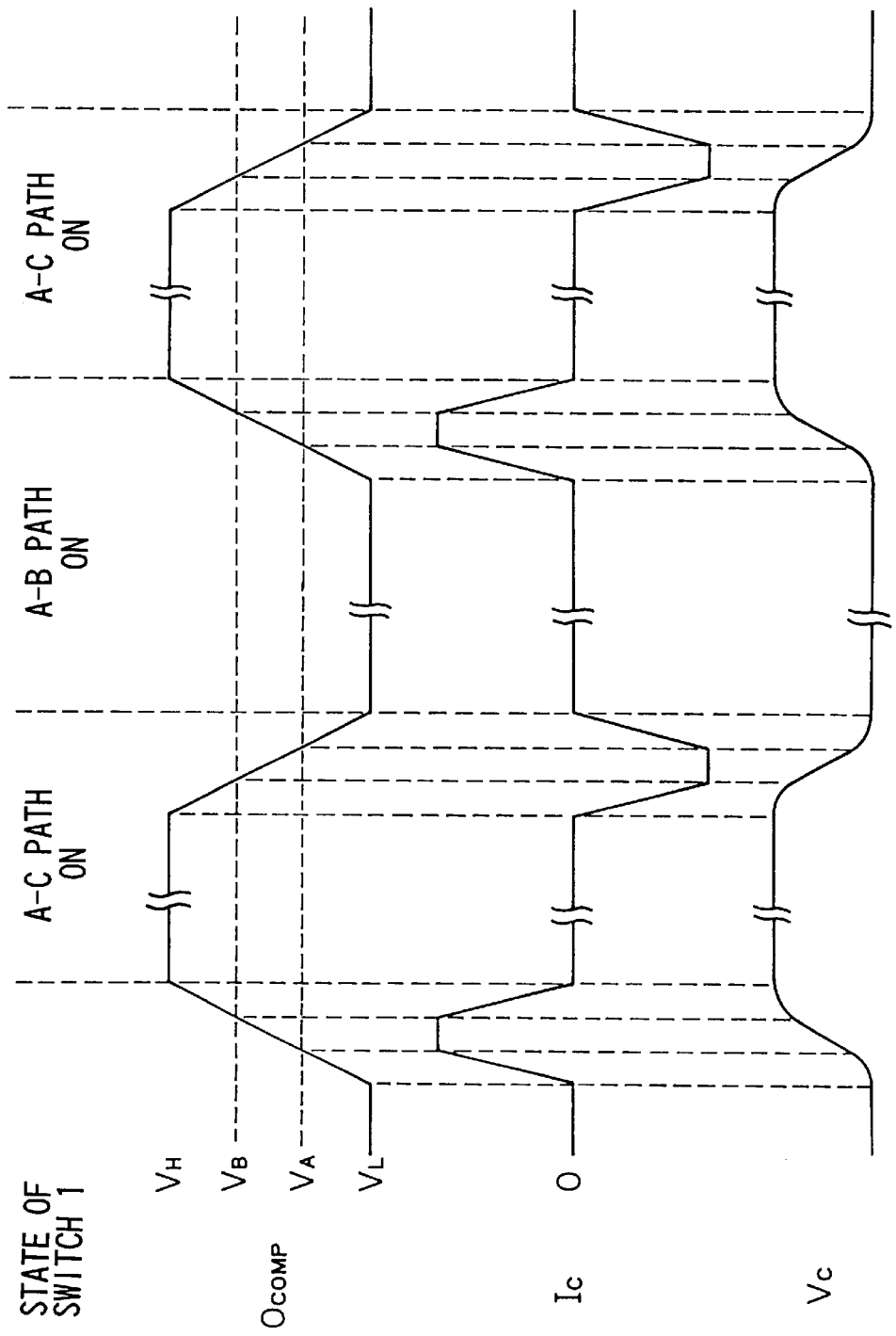
FIG. 3 is a waveform diagram showing the waveforms of the signals observed at relevant points in the switching regulator shown in FIG. 1.

FIG. 2 shows an example of the circuit configuration of the waveform shaping circuit WS. A switch 1 has three terminals A, B, and C, and turns on (i.e. closes) either the path between the terminals A and B or the path between the terminals A and C. Specifically, as shown in FIG. 3, by a non-illustrated circuit, the switch 1 is so controlled that, when the output voltage $O_{COMP}$ of the comparator COMP turns to a high level $V_H$, the path between the terminals A and C is turned on and, when the output voltage $O_{COMP}$ turns to a low level $V_L$, the path between the terminals A and B is turned on. The signal output from the comparator COMP is fed to the terminal A of the switch 1.

An operational amplifier 2 has its first non-inverting input terminal connected to the terminal B of the switch 1, and receives at its second non-inverting input terminal a reference voltage $V_A$. Here, when the voltage at the first non-inverting input terminal is lower than the voltage at the second non-inverting input terminal, the operational amplifier 2 amplifies and outputs the difference between the voltage at the first non-inverting input terminal and the voltage at the inverting input terminal and, when the voltage at the first non-inverting input terminal is equal to or higher than the voltage at the second non-inverting input terminal, the operational amplifier 2 amplifies and outputs the difference between the voltage at the second non-inverting input terminal and the voltage at the inverting input terminal.

An NPN-type transistor 3 has its base connected to the output terminal of the operational amplifier 2, has its emitter grounded through a resistor 4 and connected to the inverting input terminal of the operational amplifier 2, and has its collector connected to the collector of a PNP-type transistor 5. The transistor 5 is diode-connected, and has its base connected to the base of a PNP-type transistor 6. The transistors 5 and 6 together constitute a current mirror circuit. The transistors 5 and 6 receive at their emitters a supply voltage $V_{CC}$.

An operational amplifier 7 has its non-inverting input terminal connected through a resistor 8 to the terminal B of the switch 1, and receives at its inverting input terminal a reference voltage $V_B$. The reference voltages $V_A$ and $V_B$, and the high level $V_H$ and the low level $V_L$ output from the comparator COMP, fulfill the following relations:

$$V_L = 0,\ V_L < V_A < V_B < V_H,$$

and $$V_A + V_B = V_H.$$

A PNP-type transistor 9 has its base connected to the output terminal of the operational amplifier 7, has its emitter connected to the non-inverting input terminal of the operational amplifier 7, and has its collector connected to the collector of a PNP-type transistor 10. The transistor 10 is diode-connected, and has its base connected to the base of an NPN-type transistor 11. The transistors 10 and 11 together constitute a current mirror circuit. The transistors 10 and 11 have their emitters grounded.

An operational amplifier 12 has its non-inverting input terminal connected through a resistor 13 to the terminal C of the switch 1, and receives at its inverting input terminal the reference voltage $V_B$. A PNP-type transistor 14 has its base connected to the output terminal of the operational amplifier 12, has its emitter connected to the non-inverting input terminal of the operational amplifier 12, and has its collector connected to the collector of an NPN-type transistor 15.

The transistor 15 is diode-connected, and has its base connected to the base of an NPN-type transistor 16. The transistors 15 and 16 together constitute a current mirror circuit. The transistors 15 and 16 have their emitters grounded.

A PNP-type transistor 17 is diode-connected, and has its collector connected to the collector of the transistor 16. A PNP-type transistor 18 has its base connected to the base of the transistor 17. The transistors 17 and 18 together constitute a current mirror circuit. The transistors 17 and 18 receive at their emitters the supply voltage $V_{CC}$.

An operational amplifier 19 has its first non-inverting input terminal connected to the terminal C of the switch 1, and receives at its second non-inverting input terminal the reference voltage $V_A$. Here, when the voltage at the first non-inverting input terminal is lower than the voltage at the second non-inverting input terminal, the operational amplifier 19 amplifies and outputs the difference between the voltage at the first non-inverting input terminal and the voltage at the inverting input terminal and, when the voltage at the first non-inverting input terminal is equal to or higher than the voltage at the second non-inverting input terminal, the operational amplifier 19 amplifies and outputs the difference between the voltage at the second non-inverting input terminal and the voltage at the inverting input terminal.

An NPN-type transistor 20 has its base connected to the output terminal of the operational amplifier 19, has its emitter grounded through a resistor 21 and connected to the inverting input terminal of the operational amplifier 19, and has its collector connected to the collector of a PNP-type transistor 22.

The transistor 22 is diode-connected, and has its base connected to the base of a PNP-type transistor 23. The transistors 22 and 23 together constitute a current mirror circuit. The transistors 22 and 23 receive at their emitters the supply voltage $V_{CC}$.

An NPN-type transistor 24 is diode-connected, and has its collector connected to the collector of the transistor 23. An NPN-type transistor 25 has its base connected to the base of the transistor 24. The transistors 24 and 25 together constitute a current mirror circuit. The transistors 24 and 25 have their emitters grounded.

The collectors of the transistors 6, 11, 18, and 25 are connected together to one end of a capacitor 26, of which the other end is grounded. The waveform shaping circuit WS outputs as its output voltage the voltage $V_C$ appearing across the capacitor 26. The output voltage of the waveform shaping circuit WS is fed through the buffer amplifier BA to the gate of the transistor Tr.

Configured as described above, the waveform shaping circuit WS operates in the following manner. As shown in FIG. 3, when the output voltage $O_{COMP}$ of the comparator COMP rises from the low level $V_L$ to the high level $V_H$, if it is assumed that the resistance of each of the resistors 4, 8, 13, and 21 is equal to R, for the collector current $I_1$ of the transistor 6, the following relations hold: when $O_{COMP} < V_A$, $I_1 = O_{COMP}/R$ and, when $V_A \leq O_{COMP}$, $I_1 = V_A/R$; for the collector current $I_2$ of the transistor 11, the following relations hold: when $O_{COMP} \leq V_B$, $I_2 = 0$ and, when $V_B < O_{COMP}$, $I_2 = (O_{COMP} - V_B)/R$; for the collector currents $I_3$ and $I_4$ of the transistors 18 and 25 respectively, the following relation holds: $I_3 = I_4 = 0$. Hence, for the current $I_C$ that flows into the capacitor 26, when $O_{COMP} < V_A$, the relation $I_C = O_{COMP}/R$ holds, and thus, as $O_{COMP}$ rises, $I_C$ increases until, when $O_{COMP} = V_A$, the relation $I_C = V_A/R$ holds and thus $I_C$ becomes constant; when $O_{COMP}$ rises further such that $V_B < O_{COMP}$, the relation $I_C = V_A/R - (O_{COMP} - V_B)/R$ holds and thus, as $O_{COMP}$ rises, $I_C$ decreases until, when $O_{COMP}$ equals the high level $V_H$, the relation $I_C = 0$ holds.

By contrast, when the output voltage $O_{COMP}$ of the comparator COMP falls from the high level $V_H$ to the low level $V_L$, for $I_1$ and $I_2$, the following relation holds: $I_1 = I_2 = 0$; for $I_3$, the following relations hold: when $V_B < O_{COMP}$, $I_3 = (O_{COMP} - V_B)/R$ and, when $O_{COMP} \leq V_B$, $I_3 = 0$; for $I_4$, the following relations hold: when $V_A \leq O_{COMP}$, $I_4 = V_A/R$ and, when $O_{COMP} < V_A$, $I_4 = O_{COMP}/R$. Hence, for the current $I_C$ that flows into the capacitor 26, when $V_B < O_{COMP}$, the relation $I_C = (O_{COMP} - VB)/R - V_A/R$ holds, and thus, as $O_{COMP}$ falls, $I_C$ decreases until, when $O_{COMP} = V_B$, the relation $I_C = -V_A/R$ holds and thus $I_C$ becomes constant; when $O_{COMP}$ falls further such that $O_{COMP} < V_A$, the relation $I_C=-O_{COMP}/R$ holds and thus, as $O_{COMP}$ falls, $I_C$ increases until, when $O_{COMP}$ equals the low level $V_L$, the relation $I_C=0$ holds.

The voltage $V_C$ across the capacitor 26 is the integral of the current $I_C$ that flows into the capacitor 26, and thus has a waveform as shown in FIG. 3, i.e. a blunted version of the waveform of the output voltage $O_{COMP}$ of the comparator COMP.

Figure 5:
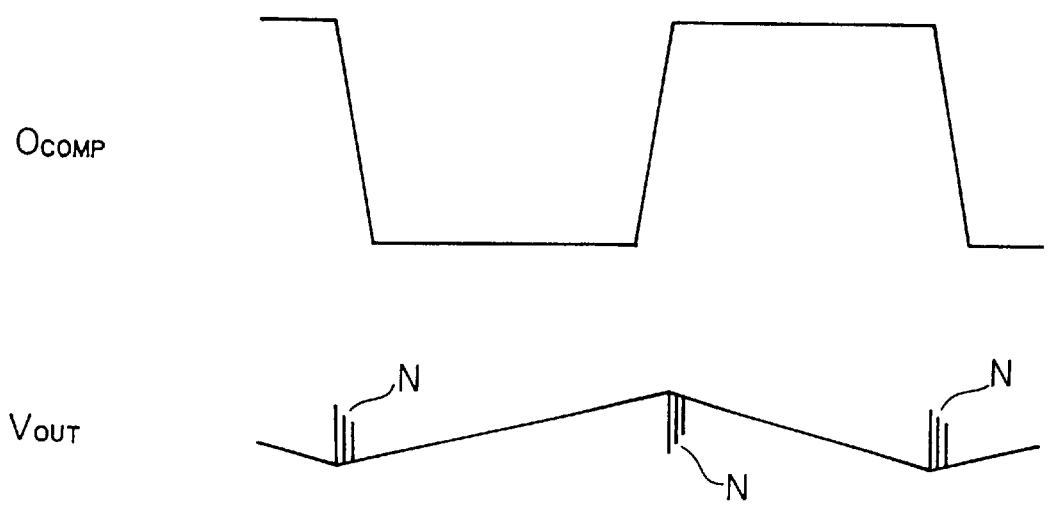
FIG. 5 is a waveform diagram showing the waveforms of the signals observed at relevant points in the switching regulator shown in FIG. 4.

In this way, the signal output from the comparator COMP is, after being cleared of high-frequency components (i.e. harmonic components) contained therein, fed to the gate of the transistor Tr. This makes it possible to significantly reduce the high-frequency noise N, as shown in FIG. 5, that appears in the output voltage $V_{OUT}$. As a result, switching regulators embodying the present invention can be used as power supply devices for supplying electric power to various appliances in audio and visual applications.

In the embodiment described above, the waveform shaping circuit WS (serving as a blunting circuit) is composed of a first circuit that generates, in a rising period of the pulse voltage from the comparator COMP, a first current having a positive peak at the center of the rising period (in the embodiment shown in FIG. 2, the first circuit is composed of, if its components are named by their reference symbols, the elements 1 to 11, and $V_A$ and $V_B$), a second circuit that generates, in a trailing period of the pulse voltage, a second current having a negative peak at the center of the trailing period (in the embodiment shown in FIG. 2, the second circuit is composed of, if its components are named by their reference symbols, the elements 12 to 25, and $V_A$ and $V_B$), and a capacitor 26 to which the first and second currents are fed. The waveform shaping circuit WS outputs as its output voltage the voltage across the capacitor 26.

The signal with which the switching device is turned on and off may be blunted in any other manner than is adopted in the embodiment described above. It is possible to connect the output of the waveform shaping circuit WS directly, i.e. not through the buffer amplifier BA, to the gate of the transistor Tr and use the input capacity of the terminal Tr with a view to omitting the capacitor 26 or reducing the capacitance of the capacitor 26. It is possible to use a bipolar transistor as the switching device. The embodiment described above deals with a switching regulator of a step-down type in which the output voltage is lower than the input voltage; however, the present invention may be applied to a switching regulator of a step-up type in which the output voltage is higher than the input voltage, or even to a switching regulator of a polarity inversion type in which the output voltage has the inverted polarity as compared with the input voltage.

As described above, in a switching regulator according to the present invention, it is possible to remove high-frequency components from the signal with which a switching device is turned on and off, and thereby significantly reduce the high-frequency noise appearing in the output voltage. This makes switching regulators usable as power supply devices for supplying electric power to various appliances in audio and visual applications. Since switching regulators are more efficient than series regulators, using switching regulators is beneficial to portable appliances that operate from batteries.

What is claimed is:

1. A switching regulator that converts a level of a direct-current voltage by turning a switching device on and off, comprising:
    a waveform shaping circuit for blunting a waveform of a signal with which the switching device is turned on and off,
    wherein the switching device is driven by an output of the waveform shaping circuit.

2. A switching regular that converts a level of a direct-current voltage by turning a switching device on and off, comprising:
    a waveform shaping circuit for blunting a waveform of a signal with which the switching device is turned on and off,
    wherein the signal with which the switching device is turned on and off is a pulse voltage, and
    the waveform shaping circuit comprises a first circuit for generating, in a rising period of the pulse voltage, a first current having a positive peak at a center of the rising period, a second circuit for generating, in a trailing period of the pulse voltage, a second current having a negative peak at a center of the trailing period, and a capacitor to which the first and second currents are fed, the waveform shaping circuit outputting a voltage across the capacitor as an output voltage.

3. A switching regulator comprising:
    a switching transistor receiving at an input electrode an input voltage and having an output electrode connected to one end of an inductance coil;
    a capacitor connected between the other end of the inductance coil and a fixed-voltage point;
    an output terminal connected to a node between the other end of the inductance coil and the capacitor;
    an error amplifier for detecting an error in an output voltage appearing at the output terminal by calculating a difference between the output voltage and a reference voltage;
    a comparator for forming a pulse by comparing a voltage output from the error amplifier and a triangular-wave voltage;
    a blunting circuit comprising a first circuit that functions in a rising period of the pulse output from the comparator for blunting a rising edge of the pulse so as to reduce harmonic components contained therein and a second circuit that functions in a trailing period of the pulse output from the comparator for blunting a trailing edge of the pulse so as to reduce harmonic components contained therein; and
    means for feeding the pulse blunted by the blunting circuit to a control electrode of the switching transistor.

4. A switching regulator comprising:
    a switching transistor receiving at an input electrode an input voltage and having an output electrode connected to one end of an inductance coil;
    a capacitor connected between the other end of the inductance coil and a fixed-voltage point;
    an output terminal connected to a node between the other end of the inductance coil and the capacitor;
    an error amplifier for detecting an error in an output voltage appearing at the output terminal by calculating a difference between the output voltage and a reference voltage;
    a comparator for forming a pulse by comparing a voltage output from the error amplifier and a triangular-wave voltage;
    a blunting circuit for blunting rising and trailing edges of the pulse output from the comparator; and
    means for feeding the pulse blunted by the blunting circuit to a control electrode of the switching transistor,
    wherein the blunting circuit comprises a first circuit for generating, in a rising period of the pulse voltage, a first current having a positive peak at a center of the rising period, a second circuit for generating, in a trailing period of the pulse voltage, a second current having a negative peak at a center of the trailing period, and a capacitor to which the first and second currents are fed, the blunting circuit outputting a voltage across the capacitor as an output voltage.

5. A switching regulator that converts a level between an input direct-current voltage and an output direct-current voltage by turning a switching device on and off, comprising:

a waveform shaping circuit that operates to reduce harmonic components contained in the output direct-current voltage, wherein the switching device is driven by an output of the waveform shaping circuit.

6. A switching regulator comprising:

a comparator for outputting a pulse train having a duty cycle in accordance with an output of the switching regulator;

a waveform shaping circuit comprising a first circuit that functions in a rising period of the pulse output from the comparator for blunting a rising edge of the pulse so as to reduce harmonic components contained therein and a second circuit that functions in a trailing period of the pulse output from the comparator for blunting a trailing edge of the pulse so as to reduce harmonic components contained therein; and a switching device receiving an output of the waveform shaping circuit and turning on and off accordingly.

* * * * *